United States Patent
Ohashi

(10) Patent No.: US 12,457,728 B2
(45) Date of Patent: Oct. 28, 2025

(54) IMAGE DATA GENERATION DEVICE AND COMPONENT MOUNTING SYSTEM

(71) Applicant: FUJI CORPORATION, Chiryu (JP)

(72) Inventor: Teruyuki Ohashi, Anjo (JP)

(73) Assignee: FUJI CORPORATION, Chiryu (JP)

( * ) Notice: Subject to any disclaimer, the term of this patent is extended or adjusted under 35 U.S.C. 154(b) by 630 days.

(21) Appl. No.: 17/905,037

(22) PCT Filed: Mar. 6, 2020

(86) PCT No.: PCT/JP2020/009857
§ 371 (c)(1),
(2) Date: Aug. 25, 2022

(87) PCT Pub. No.: WO2021/176728
PCT Pub. Date: Sep. 10, 2021

(65) Prior Publication Data
US 2023/0111622 A1     Apr. 13, 2023

(51) Int. Cl.
*H05K 13/04* (2006.01)
*G06T 7/00* (2017.01)
*H05K 13/08* (2006.01)

(52) U.S. Cl.
CPC ....... *H05K 13/0813* (2018.08); *G06T 7/0004* (2013.01); *H05K 13/046* (2013.01); *G06T 2207/30141* (2013.01)

(58) Field of Classification Search
CPC ............. H05K 13/046; H05K 13/0813; H05K 13/0815; H05K 13/0818; G06T 7/0004; G06T 2207/30141
See application file for complete search history.

(56) References Cited

U.S. PATENT DOCUMENTS

2002/0069395 A1*  6/2002  Fujiwara .............. H05K 13/083
                                                  716/112
2015/0235356 A1*  8/2015  Esaki ................. H05K 13/0812
                                                  382/141
(Continued)

FOREIGN PATENT DOCUMENTS

JP        2010-147322 A    7/2010
JP           6339316 B2    6/2018
WO     WO 2017/077591 A1   5/2017

OTHER PUBLICATIONS

International Search Report Issued May 26, 2020, in PCT/JP2020/009857, filed on Mar. 6, 2020, 2 pages.

*Primary Examiner* — Paul D Kim
(74) *Attorney, Agent, or Firm* — Oblon, McClelland, Maier & Neustadt, L.L.P.

(57) ABSTRACT

The image data generation device includes a component information input section and an image data generation section. The component information input section is configured to input a mounting position and an outer shape of the electronic component for each of the multiple electronic components to be mounted in the mounting processing. The mounting position includes a position in a height direction orthogonal to a surface of the board. The image data generation section is configured to generate image data for displaying a state when each of the multiple electronic components to be mounted in the mounting processing is arranged at the mounting position of the electronic component based on the mounting position and the outer shape of the electronic component input by the component information input section.

4 Claims, 3 Drawing Sheets

(56) References Cited

U.S. PATENT DOCUMENTS

2021/0345496 A1* 11/2021 Sasao .................. B23K 1/00
2021/0382657 A1* 12/2021 Oike .................. G06F 3/0631

* cited by examiner

IMAGE DATA GENERATION DEVICE AND COMPONENT MOUNTING SYSTEM

TECHNICAL FIELD

The present specification relates to a technology that generates image data for displaying an arrangement state of multiple electronic components after mounting processing of mounting the multiple electronic components on a board is executed.

BACKGROUND ART

For example, a component mounting machine, which mounts electronic components on a board, executes mounting processing based on mounting data that preset a mounting position of each electronic component on the board. If there is an error in the mounting data, a desired product cannot be manufactured. Therefore, in order for an operator to determine whether the mounting data is correct before the mounting processing is executed, the arrangement state of the electronic components after the mounting processing is executed according to the mounting data may be displayed on a screen. In a case where multiple electronic components (for example, two) overlap on the screen to be displayed, there is a possibility that there was an error when the mounting data is set. On the other hand, when the electronic component is mounted on the board by using the component mounting machine, another electronic component may be mounted on the electronic component which is previously mounted on the board in an overlapping manner.

In a case where the multiple electronic components are mounted in the overlapping manner, it is necessary to accurately set the up-down positions of the multiple electronic components in the mounting data. In a case where there is an error in the up-down positional relationship of the multiple electronic components on the mounting data, it is necessary to correct the mounting data. For example, JP-A-2010-147322 discloses a method of generating mounting data in a case where two electronic components are mounted in the overlapping manner. In JP-A-2010-147322, in a case where two electronic components are overlapped in the mounting data, an error is detected based on height information (layer information) of the two electronic components. The error is determined based on whether there is a conflict in the height information on the overlapped two electronic components. When the error is detected, the two electronic components in which the error is detected are displayed with additional information or the like added thereto, and the height information on the two electronic components in the mounting data is automatically or manually corrected.

BRIEF SUMMARY

Technical Problem

In the technology of JP-A-2010-147322, in a case where the two electronic components are overlapped in the mounting data, if there is the conflict in the height information on the two electronic components (for example, the two electronic components are arranged in the same layer), the error is detected, and the two electronic components are displayed in an aspect different from a case where there is no error. Therefore, the operator can determine which electronic component has the error from the display image. However, the operator cannot determine the up-down positional relationship of the two electronic components from the display image. In the technology of JP-A-2010-147322, since no error is detected if there is no conflict in the height information on the two electronic components (for example, if the two electronic components are not arranged in the same layer), even if there is an error in the up-down positional relationship of the two electronic components in the mounting data (for example, even if the up-down positional relationship is reversely set), if there is no conflict on the mounting data, the two electronic components are not displayed in a different aspect, so that it is difficult to recognize the error. In addition, since the up-down positional relationship of the two electronic components cannot be visually recognized on the display screen, the operator cannot determine whether the up-down positional relationship of the two electronic components is correct from the display screen.

The present specification discloses a technology capable of visually recognizing how multiple electronic components are overlapped in a case where multiple electronic components are mounted in an overlapping manner.

Solution to Problem

A first image data generation device disclosed in the present specification generates image data for displaying an arrangement state of multiple electronic components after mounting processing of mounting the multiple electronic components on a board is executed. The image data generation device includes a component information input section and an image data generation section. The component information input section is configured to input a mounting position and an outer shape of the electronic component for each of the multiple electronic components to be mounted in the mounting processing. The mounting position includes a position in a height direction orthogonal to a surface of the board. The image data generation section is configured to generate image data for displaying a state when each of the multiple electronic components to be mounted in the mounting processing is arranged at the mounting position of the electronic component based on the mounting position and the outer shape of the electronic component input by the component information input section. The image data generation section is configured to generate the image data for displaying one of the electronic component and another electronic component, which is mounted on a board side, in a first aspect, and for displaying the other thereof in a second aspect that is different from the first aspect, based on the position of the electronic component in the height direction, which is input by the component information input section, when the electronic component mounted in the mounting processing is mounted on a position overlapping with the other electronic component when the board after the mounting processing is viewed in plan view.

In the image data generation device described above, when electronic components are arranged so as to be overlapped in the mounting processing, it is possible to display which of the overlapped electronic components is mounted on the board side (lower side). Therefore, the operator can visually determine how the electronic components are overlapped from the display image.

A second image data generation device disclosed in the present specification generates image data for displaying an arrangement state of multiple electronic components after mounting processing of mounting the multiple electronic components on a board is executed. The image data generation device includes a component information input section and an image data generation section. The component information input section is configured to input a mounting position and an outer shape of the electronic component for each of the multiple electronic components to be mounted in the mounting processing. The mounting position includes a position in a height direction orthogonal to a surface of the board. The image data generation section is configured to generate image data for displaying a state when each of the multiple electronic components to be mounted in the mounting processing is arranged at the mounting position of the electronic component based on the mounting position and the outer shape of the electronic component input by the component information input section. The image data generation section is configured to generate the image data for displaying one of the electronic component and another electronic component, which is mounted on a board side, in a first aspect, and for displaying the other thereof in a second aspect that is different from the first aspect, based on the position of the electronic component in the height direction, which is input by the component information input section, when the electronic component mounted in the mounting processing is mounted on a position overlapping with the other electronic component, and positions of the electronic component and the other electronic component in the height direction of the board are different from each other when the board after the mounting processing is viewed in plan view. The image data generation section is configured to generate the image data for displaying the electronic component and the other electronic component in a third aspect that is different from the first aspect and the second aspect, when the electronic component mounted in the mounting processing is mounted on a position overlapping with the other electronic component, and the positions of the electronic component and the other electronic component in the height direction of the board are the same when the board after the mounting processing is viewed in plan view.

In the image data generation device described above, for example, in a case where two electronic components to be mounted on the board are overlapped in plan view and the positions thereof in the height direction are different from each other, it is possible to visually determine how the electronic components are overlapped from the display image by displaying the electronic components in the first aspect and the second aspect. On the other hand, for example, in a case where the positions of the two electronic components in the height direction are the same although the two electronic components are overlapped in the plan view, if the mounting processing is executed as they are, the two electronic components interfere with each other. In such a case, by displaying the electronic components in the third aspect, the operator can visually determine whether the electronic components interfere with each other.

A component mounting system disclosed in the present specification includes the first or second image data generation device described above, a display section configured to display the image data generated by the image data generation device, and a component mounting machine configured to execute the mounting processing.

Since the component mounting system includes the first or second image data generation device described above, it is possible to exhibit the same operation and effect as those of the first or second image data generation device described above.

DESCRIPTION OF EMBODIMENTS

Main features of embodiments described below are listed below. Technical elements described below are independent technical elements, respectively, and exhibit technical usefulness alone or by various combinations, and are not limited to the combinations described in claims at the time of filing.

An image data generation device disclosed in the present specification may further include a board information input section for inputting an outer shape of a board. The image data may be image data for displaying an arrangement state of the board and multiple electronic components when the board after mounting processing is viewed in plan view, and may be data for superimposing and displaying a board contour line representing the outer shape of the board input by a board information input section and an electronic component contour line representing the outer shape of each electronic component to be mounted in the mounting processing. According to such a configuration, an operator can easily visually grasp how the electronic component is arranged on the board.

Embodiments

Figure 1:
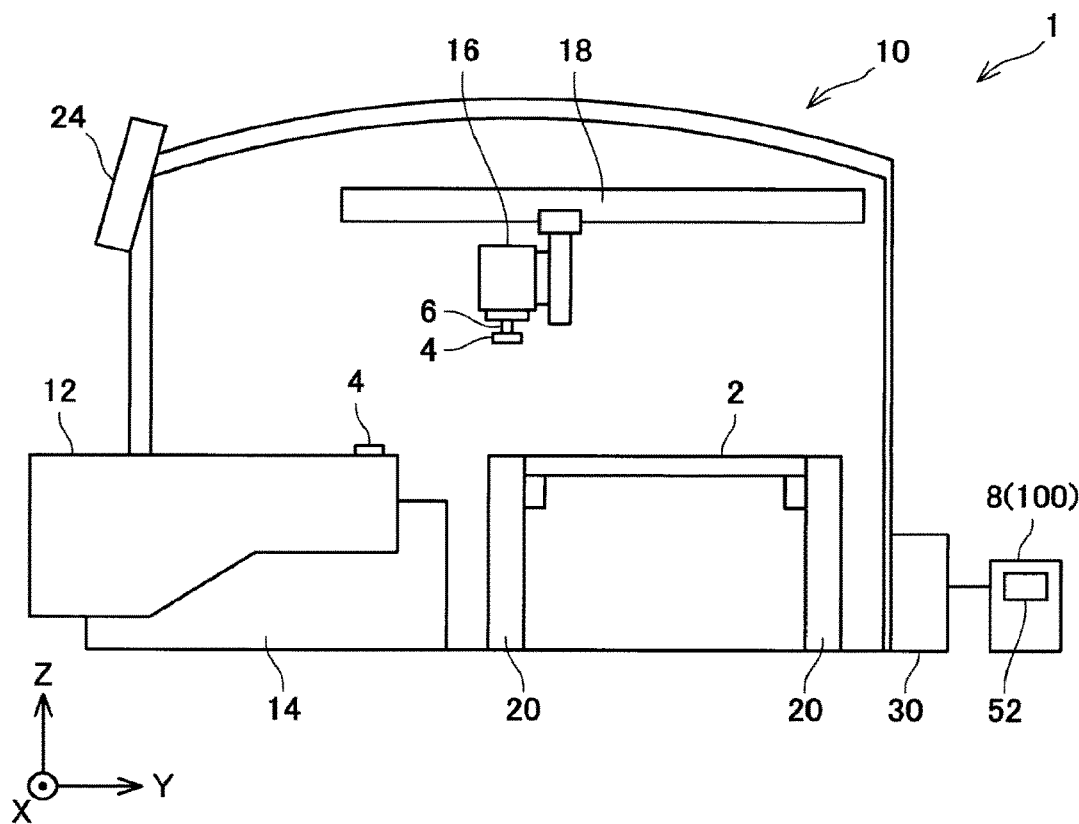
FIG. 1 is a view illustrating a schematic configuration of a component mounting system according to an embodiment.

Hereinafter, component mounting system 1 according to the embodiment will be described. As illustrated in FIG. 1, component mounting system 1 includes component mounting machine 10 and management device 8.

Component mounting machine 10 includes multiple component feeders 12, feeder holding section 14, mounting head 16, head moving device 18, board conveyor 20, touch panel 24, and control device 30. Each component feeder 12 accommodates multiple electronic components 4. Component feeder 12 is detachably attached to feeder holding section 14 and supplies electronic components 4 to mounting head 16. A specific configuration of component feeder 12 is not particularly limited. Each component feeder 12, for example, may be any of a tape-type feeder for accommodating multiple electronic components 4 on a wound tape, a tray-type feeder for accommodating multiple electronic components 4 on a tray, or a bulk-type feeder for accommodating multiple electronic components 4 randomly in a container.

Feeder holding section 14 includes multiple slots, and it is possible to detachably install component feeder 12 in each of the multiple slots. Feeder holding section 14 may be fixed to component mounting machine 10 or may be detachably attached to component mounting machine 10. Mounting head 16 detachably holds one or multiple suction nozzles 6, uses suction nozzle 6 to pick up electronic component 4 supplied by component feeder 12, and mounts electronic component 4 on circuit board 2. At this time, head moving device 18 moves mounting head 16 with respect to component feeder 12 and circuit board 2. Accordingly, electronic component 4 is picked up from specific component feeder 12 of multiple component feeders 12, and electronic component 4 is mounted on circuit board 2 at a position determined in advance. Board conveyor 20 carries in, supports, and carries out circuit board 2.

Touch panel 24 is a display device that provides the operator with various information on component mounting machine 10, as well as an input device that receives instructions and information from the operator. Control device 30 is configured using a computer including a CPU and a memory. Control device 30 is communicably connected to management device 8. Control device 30 controls an operation of each section of component mounting machine 10 based on a production program (mounting data) transmitted from management device 8.

Figure 2:
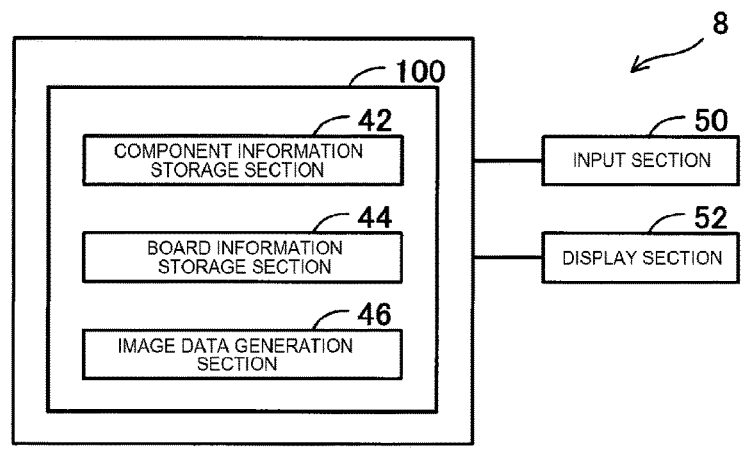
FIG. 2 is a diagram illustrating a configuration of an image data generation device and a management device.

Management device 8 is configured using a computer including a CPU and a memory. Management device 8 is communicably connected to component mounting machine 10. Management device 8 determines a type, a position, and the like of electronic component 4 to be mounted on circuit board 2 by component mounting machine 10, and instructs component mounting machine 10 to do so. When component mounting machine 10 operates based on an instruction from management device 8, electronic components 4 necessary for circuit board 2 are mounted on circuit board 2. As illustrated in FIG. 2, management device 8 includes input section 50 and display section 52. Input section 50 receives an input of component information (described later) and board information (described later) of each electronic component 4. Display section 52 displays the image data generated by image data generation section 46 which is described later.

In addition, management device 8 functions as image data generation device 100 illustrated in FIG. 2 by executing a program stored in a memory. Image data generation device 100 includes image data generation section 46, and generates image data for displaying an arrangement state of multiple electronic components 4 on circuit board 2 after component mounting machine 10 has executed the mounting processing in accordance with a production program (mounting data). The processing of image data generation section 46 will be described in detail later.

As illustrated in FIG. 2, image data generation device 100 includes component information storage section 42 and board information storage section 44. Component information storage section 42 stores, for each of multiple electronic components 4 used in the mounting processing, a mounting position, an outer shape, and a mounting order on circuit board 2 (hereinafter, also collectively referred to as component information on each electronic component 4). The mounting position includes coordinates (X-coordinate and Y-coordinate) of electronic component 4 on circuit board 2, a mounting angle of the coordinates with respect to X-axis or Y-axis, and a position in a height direction orthogonal to a surface of circuit board 2. The position in the height direction is indicated by a hierarchy with respect to the surface of circuit board 2. That is, with respect to electronic component 4 mounted on the surface of circuit board 2, the position in the height direction is stored as hierarchy 1. With respect to electronic component 4 (hereinafter, also simply referred to as "electronic component 4 to be mounted in an overlapping manner") overlapped to be mounted on electronic component 4 which is mounted on the surface of circuit board 2, the position in the height direction is stored as hierarchy 2. The position in the height direction is not limited to the two layers of hierarchy 1 and hierarchy 2. In a case where three or more electronic components 4 are mounted in the overlapping manner in the height direction, the position in the height direction can be set using hierarchy 3 or more in addition to hierarchy 1 and hierarchy 2. In addition, in the present embodiment, the position in the height direction is illustrated in hierarchy, but the position is not limited to such a configuration. As long as the position in the height direction orthogonal to the surface of circuit board 2 is indicated, the position in the height direction may be indicated by, for example, a distance (for example, 0 mm, 1 mm, or the like) from the surface of circuit board 2.

Figure 5:
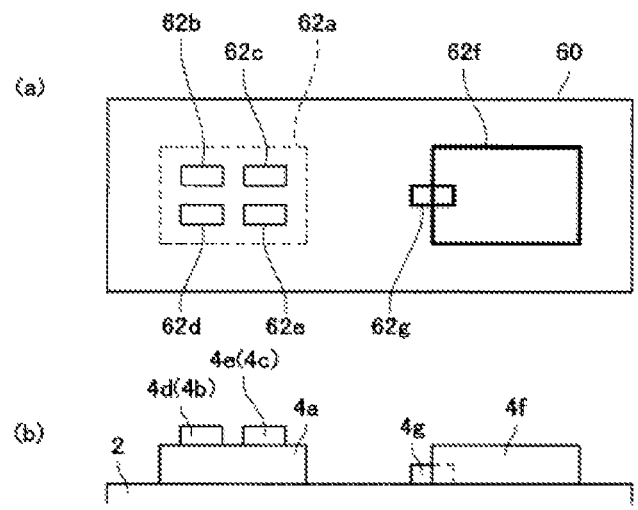
FIG. 5(*a*) is a view illustrating an example of image data, and FIG. 5(*b*) is a side view illustrating an arrangement state of electronic components corresponding to FIG. 5(*a*).

In addition, with respect to electronic component 4 to be mounted in the overlapping manner, information indicating that electronic component 4 to be mounted below electronic component 4 is to be mounted is also stored together with the mounting order of electronic components 4 of all electronic components 4 to be mounted on circuit board 2. For example, as illustrated in FIG. 5(b), it is assumed that electronic component 4b is mounted on electronic component 4a. In this case, the component information on electronic component 4b includes information indicating that electronic component 4b is to be mounted after electronic component 4a is mounted, as well as the mounting order of electronic component 4b. The component information on electronic component 4b includes the information indicating that electronic component 4b is to be mounted after electronic component 4a is mounted, and thereby electronic components 4a and 4b can be mounted in an accurate up-down positional relationship. The information defining the up-down positional relationship of two electronic components 4 that overlap with each other is not limited to the above-described configuration. Electronic component 4a to be mounted below may include information indicating that electronic component 4a is to be mounted ahead of electronic component 4b to be mounted above. In addition, it may be defined such that after all electronic components 4 of which the positions in the height direction are in hierarchy 1 (to be mounted on the surface of circuit board 2) are mounted, electronic component 4 of which the position in the height direction is in hierarchy 2 (to be mounted on electronic component 4 of which the position in the height direction is in hierarchy 1) is mounted. The component information on each electronic component 4 is input from input section 50 and stored in component information storage section 42 of image data generation device 100.

Board information storage section 44 stores the outer shape of circuit board 2 used in the mounting processing (hereinafter, also referred to as board information). The board information is input from input section 50 provided in management device 8, and is stored in board information storage section 44 of image data generation device 100.

Figure 3:
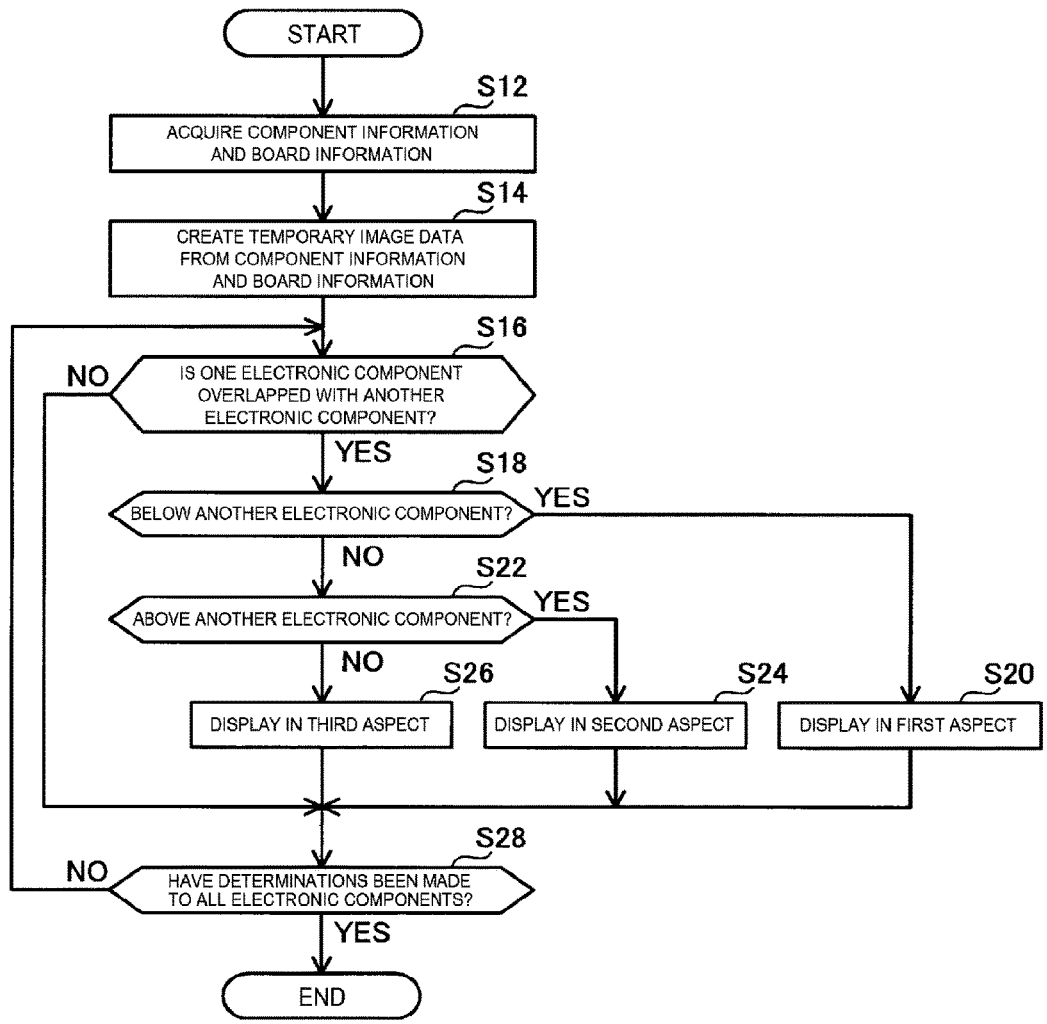
FIG. 3 is a flowchart illustrating an example of processing of generating image data in the image data generation device.

FIG. 3 is a flowchart illustrating an example of processing by which image data generation device 100 generates the image data. When multiple electronic components 4 are mounted on circuit board 2 using component mounting machine 10, mounting data (that is, component information) for setting the mounting position of each electronic component 4 on circuit board 2 in advance is used. However, if there is an error in the component information, a desired product cannot be manufactured. In particular, in a case where electronic components 4 are mounted in the overlapping manner, it is necessary to accurately set not only the positions of electronic components 4 on circuit board 2 (that is, the positions when the circuit board is viewed in plan), but also the up-down arrangement position between the overlapping electronic components 4. In order to enable the operator to visually determine whether the component information is accurately set, image data generation device 100 generates the image data displaying the arrangement state of multiple electronic components 4 on circuit board 2 in a case of being mounted using the set component information.

As illustrated in FIG. 3, first, image data generation device 100 acquires the component information and the board information (S12) The component information and the board information are input from input section 50. The input component information is stored in component information storage section 42, and the input board information is stored in board information storage section 44.

Next, image data generation section 46 creates temporary image data based on the component information stored in component information storage section 42 and the board information stored in board information storage section 44 (S14). The temporary image data is image data indicating only the arrangement positions of circuit board 2 and each of multiple electronic components 4 on circuit board 2 when circuit board 2 is viewed in plan view. The temporary image data is configured of board contour line 60 (refer to FIG. 4) indicating the outer shape of circuit board 2, and electronic component contour line 62 (refer to FIG. 4) indicating the outer shape of each electronic component 4 when circuit board 2 is viewed in plan view. In the temporary image data, even in a case where multiple electronic components 4 overlap with each other, the up-down arrangement position of electronic components 4 is not visually recognized.

Figure 4:
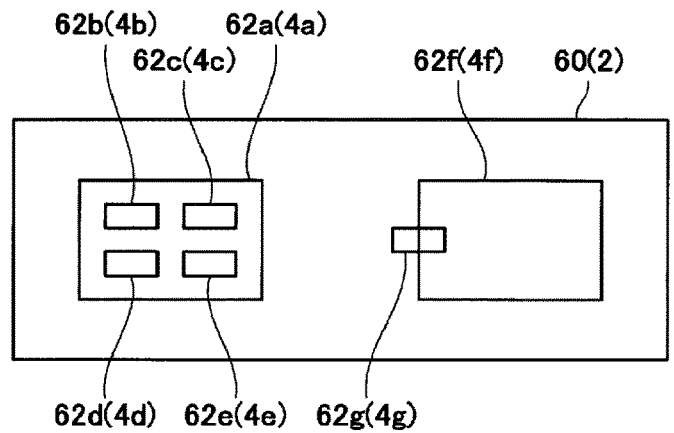
FIG. 4 is a view illustrating an example of temporary image data.

FIG. 4 illustrates an example of the temporary image data. As illustrated in FIG. 4, image data generation section 46 generates board contour line 60 based on the board information stored in board information storage section 44. Specifically, image data generation section 46 generates board contour line 60 from the outer shape of circuit board 2 included in the board information. In addition, image data generation section 46 generates electronic component contour line 62 for each of multiple electronic components 4 based on the component information stored in component information storage section 42. Specifically, image data generation section 46 generates electronic component contour line 62 from the coordinates, the mounting angle, and the outer shape of each electronic component 4 included in the component information.

In FIG. 4, all electronic component contour lines 62a to 62g are generated in board contour line 60. Therefore, it is possible to grasp the mounting position of electronic component 4 with respect to circuit board 2. Electronic component contour lines 62b to 62e are generated in electronic component contour line 62a. Therefore, it is possible to grasp on the image that electronic component 4 (hereinafter, also referred to as electronic component 4a) corresponding to electronic component contour line 62a overlaps with each of electronic components 4 (hereinafter, also referred to as electronic components 4b to 4e) corresponding to electronic component contour lines 62b to 62e. However, in the temporary image data, it is impossible to grasp whether electronic component 4a is located above or below electronic components 4b to 4e. In addition, electronic component contour line 62f intersects electronic component contour line 62g. Therefore, it is possible to grasp that a part of electronic component 4 (hereinafter, also referred to as electronic component 4f) corresponding to electronic component contour line 62f overlaps with a part of electronic component 4 (hereinafter, also referred to as electronic component 4g) corresponding to electronic component contour line 62g. However, in the temporary image data, it is impossible to grasp whether a part of electronic component 4f is located above or below a part of electronic component 4g.

Next, image data generation section 46 determines whether one electronic component 4 (hereinafter, also referred to as related electronic component 4) overlaps with another electronic component 4 (S16). This determination determines whether areas (x1 to x2, and y1 to y2) surrounded by electronic component contour line 62 of electronic component 4 overlap with areas (x1' to x2', and y1' to y2') surrounded by electronic component contour line 62 of another electronic component 4. For example, in a case where areas x1 to x2 and x1' to x2' in the x-direction overlap with each other and areas y1 to y2 and y1' to y2' in the y-direction overlap with each other, it is determined that electronic component 4 and another electronic component 4 overlap with each other. In a case where both the areas in the x-direction and the area in the y-direction do not overlap with each other, it is determined that electronic component 4 and another electronic component 4 do not overlap with each other.

In a case where related electronic component 4 does not overlap with another electronic component 4 (NO in step S16), processing of steps S16 to S26 is skipped. On the other hand, in a case where related electronic component 4 overlaps with another electronic component 4 (YES in step S16), image data generation section 46 determines whether related electronic component 4 is below another electronic component 4 that overlaps with related electronic component 4 (S18). When determining whether related electronic component 4 is below another electronic component 4, image data generation section 46 uses the position in the height direction in the component information stored in component information storage section 42. That is, image data generation section 46 compares the position of electronic component 4 in the height direction with the position of another electronic component 4 in the height direction to determine whether related electronic component 4 is below another electronic component 4. In a case where related electronic component 4 is below another electronic component 4 (YES in step S18), image data generation section 46 displays electronic component contour line 62 corresponding to related electronic component 4 in a first aspect (S20). The first aspect indicates that it is located below, and is, for example, a black dashed line.

For example, electronic component 4a corresponding to electronic component contour line 62a in FIG. 4 overlaps with electronic components 4b to 4e. Here, as illustrated in FIG. 5(b), it is assumed that electronic component 4a is disposed below electronic components 4b to 4e. In this case, the position in the height direction of the component information on electronic component 4a is set so as to be lower than the position in the height direction of the component information on electronic components 4b to 4e. That is, the position of electronic component 4a in the height direction in the component information is set to be hierarchy 1, and the positions of electronic components 4b to 4e in the height direction in the component information are set to be hierarchy 2. Therefore, image data generation section 46 determines that electronic component 4a is below electronic components 4b to 4e (YES in step S18). Then, as illustrated in FIG. 5(a), image data generation section 46 changes electronic component contour line 62a corresponding to electronic component 4a to a black dashed line that is the first aspect (S20).

On the other hand, in a case where electronic component 4 is not below another electronic component 4 (NO in step S18), image data generation section 46 determines whether related electronic component 4 is above another electronic component 4 overlapping with related electronic component 4 (S22). Even when determining whether related electronic component 4 is above another electronic component 4, image data generation section 46 uses the position in the height direction in the component information stored in component information storage section 42. That is, image data generation section 46 compares the position of related electronic component 4 in the height direction with the position of another electronic component 4 in the height direction to determine whether related electronic component 4 is above another electronic component 4. In a case where related electronic component 4 is above another electronic component 4 (YES in step S22), image data generation section 46 displays electronic component contour line 62 corresponding to related electronic component 4 in a second aspect which is different from the first aspect (S24). The second aspect indicates that the related electronic component is located above, and is, for example, a black solid line.

Figure 6:
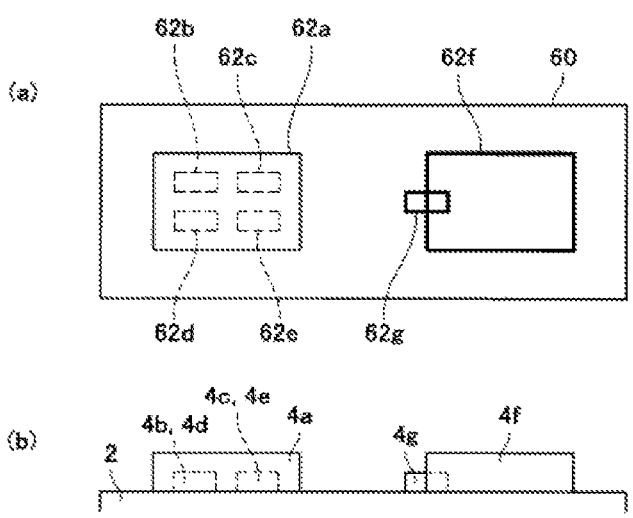
FIG. 6(*a*) is a view illustrating another example of the image data, and FIG. 6(*b*) is a side view illustrating an arrangement state of electronic components corresponding to FIG. 6(*a*).

For example, as illustrated in FIG. 6(b), it is assumed that electronic component 4a is disposed on electronic components 4b to 4e. In this case, the position of electronic component 4a in the height direction in the component information is set so as to be higher than the positions of electronic components 4b to 4e in the height direction in the component information. That is, the position of electronic component 4a in the height direction in the component information is set to be hierarchy 2, and the positions of electronic components 4b to 4e in the height direction in the component information are set to be hierarchy 1. Therefore, image data generation section 46 determines that electronic component 4a is above electronic components 4b to 4e (YES in step S20). Then, as illustrated in FIG. 6(a), image data generation section 46 sets electronic component contour line 62a corresponding to electronic component 4a to be the black solid line (that is, the state in the temporary image data is maintained) that is the second aspect (S20).

On the other hand, in a case where related electronic component 4 is not above another electronic component 4 (NO in step S22), related electronic component 4 is not below or above another electronic component 4 in the component information although related electronic component 4 overlaps with another electronic component 4. Such setting is likely to be incorrect. Therefore, image data generation section 46 displays related electronic component 4 in a third aspect which is different from the first aspect and the second aspect (S26). The third aspect indicates to the operator a possibility of an error, and is, for example, a line of a color which is different from those of the first aspect and the second aspect, such as a red line.

For example, as illustrated in FIG. 4, in electronic components 4f and 4g, although a part of electronic component 4f and a part of electronic component 4g overlap with each other on the temporary image data, it is assumed that electronic components 4f and 4g do not overlap with each other in a desired product. That is, it is assumed that there is an error in the coordinates of at least one electronic information on electronic components 4f and 4g. In such a case, since electronic components 4f and 4g are set on the assumption that they do not overlap with each other, the positions of electronic components 4f and 4g in the height direction in the component information are both in hierarchy 1. Accordingly, image data generation section 46 determines in step S16 that electronic component 4f overlaps with another electronic component 4g (YES in step S16), determines in step S18 that electronic component 4f is not below another electronic component 4g (NO in step S18), and determines in step S22 that electronic component 4f is not above another electronic component 4g (NO in step S22).

Then, as illustrated in FIG. 5(a), image data generation section 46 changes electronic component contour line 62f corresponding to electronic component 4f to the red line (indicated by thick lines in FIG. 5(a)) that is the third aspect (S26).

When the processing of steps S12 to S26 is terminated, image data generation section 46 determines whether the processing of steps S16 to S26 has been executed for all electronic components 4 to be mounted on circuit board 2 (S28). In a case where the processing of steps S16 to S26 is not executed for all electronic components 4 (NO in step S28), the processing returns to step S16, and the processing of steps S16 to S26 is repeated for electronic components 4 for which the processing of steps S16 to S26 are not executed.

For example, in the example illustrated in FIG. 5(b), it is determined that electronic component 4a is disposed below electronic components 4b to 4e when the processing of steps S16 to S26 is performed first, and is changed to the dashed line (first aspect) in the image data. Thereafter, the processing of steps S16 to S26 is also executed for electronic component 4b. That is, image data generation section 46 determines in step S16 that electronic component 4b overlaps with another electronic component 4a (YES in step S16), determines in step S18 that electronic component 4b is not below another electronic component 4a (NO in step S18), and determines in step S22 that electronic component 4b is above another electronic component 4a (YES in step S22). Then, as illustrated in FIG. 5(a), image data generation section 46 sets electronic component contour line 62b corresponding to electronic component 4b to be the black solid line (that is, the state in the temporary image data is maintained) that is the second aspect (S20). Similarly, the processing of steps S16 to S26 is executed for all electronic components 4.

On the other hand, in a case where the processing of steps S16 to S26 is executed for all electronic components 4 (YES in step S28), the determination of the up-down positional relationship for all electronic components 4 with another electronic component 4 is terminated, so that the image data is completed. Image data generation device 100 stores the completed image data in a memory (not illustrated), and terminates the processing. The image data stored in the memory is read by the operator and displayed on display section 52 of management device 8.

Image data generation device 100 of the present embodiment generates the image data for displaying electronic component 4 located above and electronic component 4 located below in different aspects with respect to two electronic components 4 to be mounted in the overlapping manner using the component information (mounting data) that is set in advance. Therefore, the operator can visually grasp whether electronic component 4 to be mounted in the overlapping manner on another electronic component is disposed below or above another electronic component 4. For example, when two electronic components 4 to be mounted in the overlapping manner in the image data are displayed in the same aspect, it is possible to grasp that two electronic components 4 overlap with each other, but it is impossible to grasp whether up-down positional relationship of two electronic components 4 is correct. Therefore, in order to confirm the up-down positional relationship of two electronic components 4, it is necessary to confirm not only the image data but also the component information. In the present embodiment, since the up-down positional relationship of two electronic components 4 to be mounted in the overlapping manner can be grasped only with the image data, it is possible to reduce the load on the operator. In particular, even in a case where the up-down positional relationship of two electronic components 4 to be mounted in the overlapping manner is reversely set to a desired product, the operator can easily discover such a setting error from the image data.

In addition, image data generation device 100 of the present embodiment generates, using component information (mounting data) set in advance, image data to be displayed in an aspect (third aspect) different from the aspect indicating the up-down positional relationship of two electronic components 4 in a case where the positions of two electronic components 4 to be mounted in the overlapping manner in the height direction are the same. In a case where the positions in the height direction are the same although two electronic components 4 overlap with each other, there is a high possibility of a setting error in the component information. By displaying such electronic components 4 in different aspects, the operator can suitably grasp electronic components 4 having a high possibility of the setting error.

In the present embodiment, when generating the temporary image data, image data generation section 46 displays electronic component contour line 62 in the same aspect regardless of the position of electronic component 4 in the height direction, but is not limited to such a configuration. When generating the temporary image data, image data generation section 46 may display electronic component contour line 62 of each electronic component 4 in a different display aspect for each hierarchy based on the position in the height direction in the component information. For example, when generating the temporary image data, image data generation section 46 may display electronic component contour line 62 of electronic component 4 in which the position in the height direction is set to be hierarchy 1 in the first aspect (for example, the black dashed line), and may display electronic component contour line 62 of electronic component 4 in which the position in the height direction is set to be hierarchy 2 in the second aspect (for example, the black solid line). Thereafter, image data generation section 46 determines whether electronic component 4 overlaps with another electronic component 4, and in a case where electronic component 4 overlaps with another electronic component 4 and the positions of the two in the height direction are the same, the display aspect of electronic component 4 may be changed from the first aspect or the second aspect to the third aspect (for example, the red line) to obtain the image data.

In addition, in the present embodiment, the processing of generating image data by image data generation section 46 is described by taking an example in which two electronic components 4 overlap with each other, but the number of electronic components 4 to be overlapped in the height direction (the number of hierarchies) is not limited. Image data generation section 46 may generate image data based on the mounting data in which three or more electronic components 4 are mounted in the overlapping manner in the height direction. In a case where three or more electronic components 4 are overlapped in the height direction, image data generation section 46 may display electronic component contour lines 62 in a different aspect for each hierarchy. For example, in a case where three electronic components 4 are overlapped in the height direction, image data generation section 46 may display electronic component contour line 62 of electronic component 4 in which the position in the height direction is set to hierarchy 1 in the first aspect, display electronic component contour line 62 of electronic component 4 in which the position in the height direction is set to hierarchy 2 in the second aspect, and display electronic component contour line 62 of electronic component 4 in which the position in the height direction is set to hierarchy 3 in the third aspect. In this case, in a case where electronic component 4 overlaps with another electronic component 4 and the positions in the height direction are the same (in a case where there is a setting error), electronic component contour lines 62 of those electronic components 4 may be displayed in a fourth aspect different from the first to third aspects.

In addition, in the present embodiment, image data generation device 100 is provided in management device 8, but is not limited to such a configuration. For example, it may be provided in a PC separate from management device 8, or may be provided in component mounting machine 10.

Although specific examples of the technology disclosed in the present specification have been described in detail above, they are merely examples and are not intended to limit the scope of the claims. The technology described in the scope of the claims includes various modifications and changing of the specific examples illustrated above. In addition, the technical elements described in the present specification or the drawings exhibit technical usefulness alone or in various combinations and are not limited to the combinations described in the claims at the time of filing. In addition, the technology exemplified in the present specification or the drawings simultaneously achieves multiple purposes, and has technical usefulness with achieving one purpose itself of the multiple purposes.

The invention claimed is:

1. An image data generation device that generates image data for displaying an arrangement state of multiple electronic components after mounting processing of mounting the multiple electronic components on a board is executed, the image data generation device comprising:
   a component information input section configured to input a mounting position and an outer shape of an electronic component for each of the multiple electronic components to be mounted in the mounting processing, the mounting position including a position in a height direction orthogonal to a surface of the board; and
   an image data generation section configured to generate the image data for displaying a state when each of the multiple electronic components to be mounted in the mounting processing is arranged at the mounting position of the electronic component based on the mounting position and the outer shape of the electronic component input by the component information input section, the image data generation section being configured to generate the image data for displaying one of the electronic component and an other electronic component, which is mounted on a board side, in a first aspect, and for displaying the other electronic component in a second aspect that is different from the first aspect, based on the position of the electronic component in the height direction, which is input by the component information input section, when the electronic component mounted in the mounting processing is mounted on a position overlapping with the other electronic component when the board after the mounting processing is viewed in plan view.

2. An image data generation device that generates image data for displaying an arrangement state of multiple electronic components after mounting processing of mounting the multiple electronic components on a board is executed, the image data generation device comprising:

a component information input section configured to input a mounting position and an outer shape of an electronic component for each of the multiple electronic components to be mounted in the mounting processing, the mounting position including a position in a height direction orthogonal to a surface of the board; and an image data generation section configured to generate the image data for displaying a state when each of the multiple electronic components to be mounted in the mounting processing is arranged at the mounting position of the electronic component based on the mounting position and the outer shape of the electronic component input by the component information input section, the image data generation section being configured to generate the image data for displaying one of the electronic component and an other electronic component, which is mounted on a board side, in a first aspect, and for displaying the other electronic component in a second aspect that is different from the first aspect, based on the position of the electronic component in the height direction, which is input by the component information input section, when the electronic component mounted in the mounting processing is mounted on a position overlapping with the other electronic component, and positions of the electronic component and the other electronic component in the height direction of the board are different from each other when the board after the mounting processing is viewed in plan view, and to generate the image data for displaying the electronic component and the other electronic component in a third aspect that is different from the first aspect and the second aspect, when the electronic component mounted in the mounting processing is mounted on a position overlapping with the other electronic component, and the positions of the electronic component and the other electronic component in the height direction of the board are the same when the board after the mounting processing is viewed in plan view.

3. The image data generation device according to claim 1, further comprising:
  a board information input section configured to input an outer shape of the board,
  wherein the image data is image data for displaying an arrangement state of the board and the multiple electronic components when the board after the mounting processing is viewed in plan view, and is data for displaying a board contour line representing the outer shape of the board input by the board information input section and an electronic component contour line representing the outer shape of each of the electronic components to be mounted in the mounting processing in an overlapping manner.

4. A component mounting system comprising:
  the image data generation device according to claim 1;
  a display section configured to display the image data generated by the image data generation device; and
  a component mounting machine configured to execute the mounting processing.

* * * * *